(12) United States Patent
Nam et al.

(10) Patent No.: US 8,592,104 B2
(45) Date of Patent: Nov. 26, 2013

(54) MASK FOR FORMING PATTERNS OF SEMICONDUCTOR DEVICE

(75) Inventors: Yun-Suk Nam, Yongin-si (KR);
Si-Young Choi, Seongnam-si (KR);
Yong-Kug Bae, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 13/224,471

(22) Filed: Sep. 2, 2011

(65) Prior Publication Data

US 2012/0058420 A1 Mar. 8, 2012

(30) Foreign Application Priority Data

Sep. 3, 2010 (KR) .................. 10-2010-0086717

(51) Int. Cl.
*G03F 1/70* (2012.01)
(52) U.S. Cl.
USPC ............................................. 430/5
(58) Field of Classification Search
USPC ........................................ 430/5, 322, 394
See application file for complete search history.

(56) References Cited

U.S. PATENT DOCUMENTS 7,122,281 B2 * 10/2006 Pierrat .......................... 430/5

FOREIGN PATENT DOCUMENTS

| JP | 11-231506 | 8/1999 |
| KR | 1997-0076066 | 12/1997 |
| KR | 1020020045730 | 6/2002 |

* cited by examiner

*Primary Examiner* — Stephen Rosasco
(74) *Attorney, Agent, or Firm* — Myers Bigel Sibley & Sajovec, P.A.

(57) ABSTRACT

A mask for forming patterns of a semiconductor device is provided. The mask includes first and second main patterns disposed to be spaced apart from each other about a cross point and extending in first and second directions different from each other, a third main pattern disposed spaced apart from the first and second main patterns while being disposed between the first and second main patterns so as to overlap the cross point, and at least one auxiliary pattern spaced apart from the third main pattern in the periphery of a portion of the third main pattern, which is not adjacent with the first and second main patterns.

20 Claims, 10 Drawing Sheets

MASK FOR FORMING PATTERNS OF SEMICONDUCTOR DEVICE

CROSS-REFERENCE TO RELATED APPLICATION

This application claims priority from Korean Patent Application No. 10-2010-0086717 filed on Sep. 3, 2010 in the Korean Intellectual Property Office, and all the benefits accruing therefrom under 35 U.S.C. 119, the contents of which in its entirety are herein incorporated by reference.

BACKGROUND OF THE INVENTION

1. Field of the Invention

The present invention relates to a mask for forming patterns of a semiconductor device, and, more particularly, to a mask for forming patterns of a semiconductor device, which can transfer the shape of a mask pattern as it is onto a photoresist.

2. Description of the Related Art

A predetermined pattern of a semiconductor device, for example, a gate electrode, a bit line, a metal wire, or the like, is generally formed by a photolithography technique.

A photolithography technique generally includes a sequence or series of steps of coating photoresist on a semiconductor substrate having a predetermined layer formed thereon, transferring a pattern formed on the mask (to be referred to as a mask pattern hereinafter) onto the photoresist by exposing the photoresist to light using a mask, and performing a develop, thereby forming a photoresist pattern. Thereafter, a desired pattern can be obtained by etching the predetermined layer using the photoresist pattern.

To obtain a desired shaped pattern using the photolithography technique, it is primarily necessary to transfer the shape of a mask pattern as it is onto a photoresist.

When a photoresist pattern is implemented by exposing mask patterns crossing each other in different directions, for example, a vertical pattern and a horizontal pattern, which cross each other in a perpendicular direction, a shape of the photoresist pattern and a shape of the mask pattern are different at the edge where the horizontal pattern and the vertical pattern of the mask pattern are connected by the optical proximity effect. In detail, the mask pattern is angulated at the connecting portion of the horizontal pattern and the vertical pattern, while the photoresist pattern is rounded at the connecting portion of the horizontal pattern and the vertical pattern.

Accordingly, it is necessary to develop techniques of accurately transferring a mask pattern as it is onto a photoresist by suppressing the optical proximity effect.

SUMMARY

The present invention provides a mask for forming patterns of a semiconductor device, which can maximally transfer the shape of a mask pattern as it is onto a photoresist.

According to an aspect of the present invention, there is provided a mask including first and second main patterns disposed to be spaced apart from each other about a cross point and extending in first and second directions different from each other, a third main pattern disposed spaced apart from the first and second main patterns while being disposed between the first and second main patterns so as to overlap the cross point, and at least one auxiliary pattern spaced apart from the third main pattern in the periphery of a portion of the third main pattern, which is not adjacent with the first and second main patterns.

BRIEF DESCRIPTION OF THE DRAWINGS

The above and other features and advantages of the present invention will become more apparent by describing in detail embodiments thereof with reference to the attached drawings in which.

DETAILED DESCRIPTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The present invention will be described with reference to cross-sectional views and/or schematic views, in which embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in the manufacturing processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following description, a main pattern of a mask pattern formed on a mask refers to a pattern that is actually transferred onto a photoresist by exposure, and an auxiliary pattern refers to a pattern having a line width not greater than a limit resolution, so that it exists in a mask but is not transferred onto a photoresist by exposure.

Figure 1:
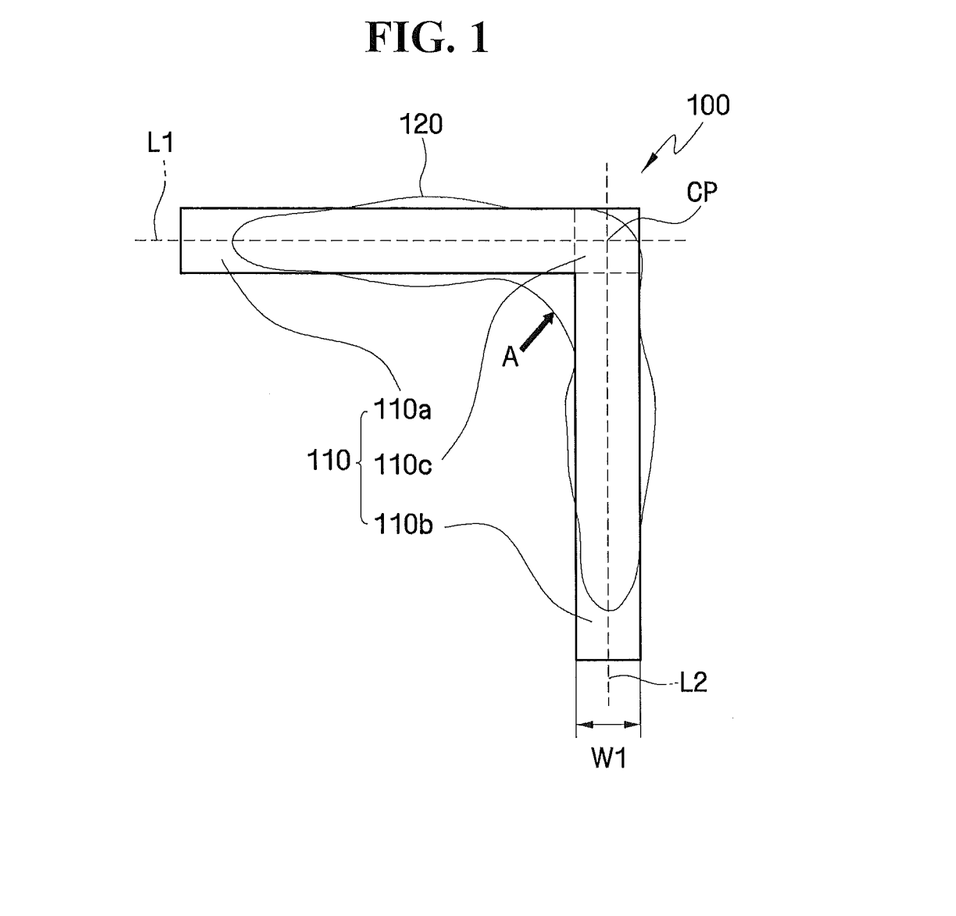
FIGS. 1 through 3 illustrate masks to be compared with a mask shown in FIG. 4.
Figure 2:
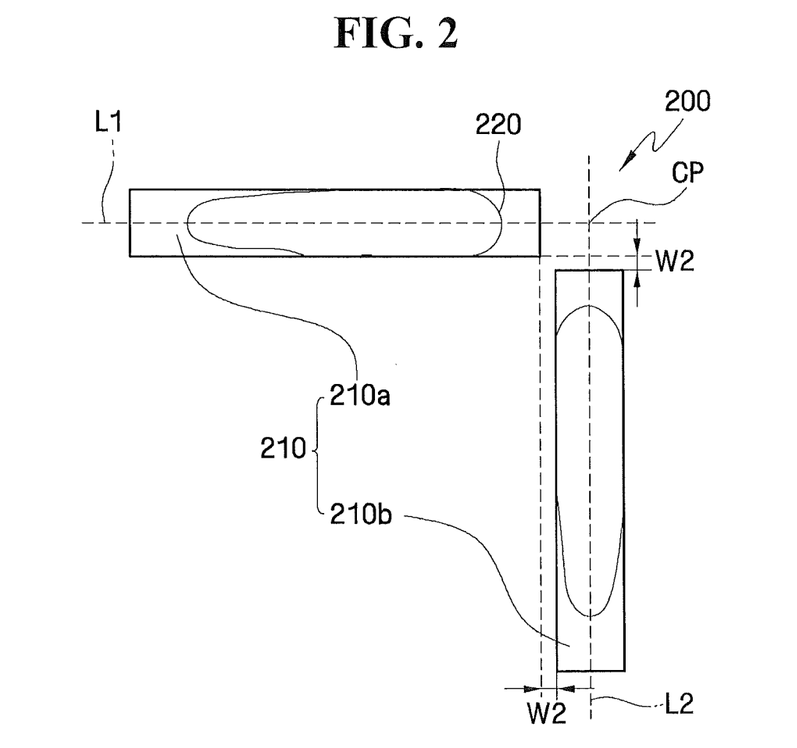
Figure 3:
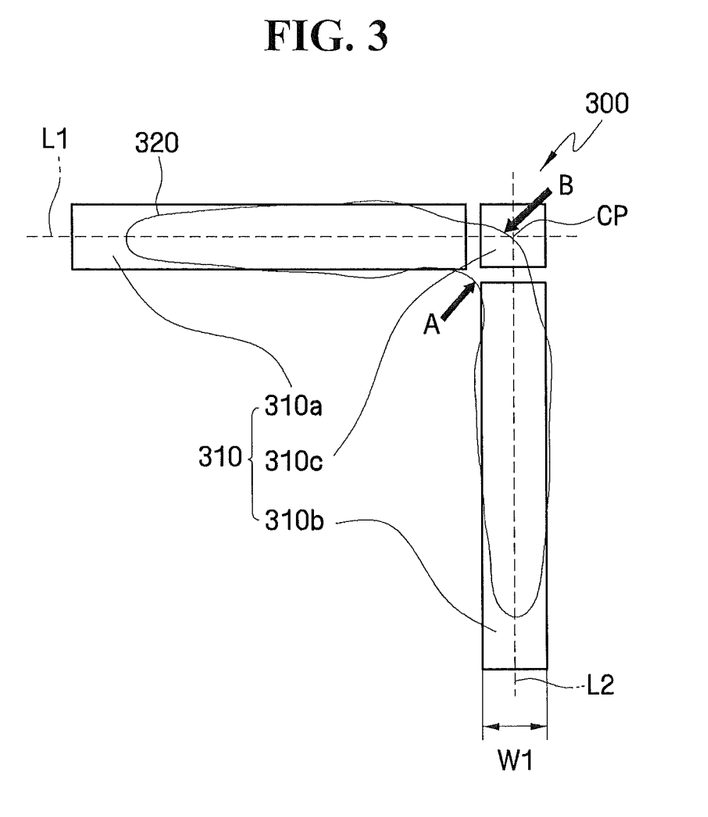
Figure 4:
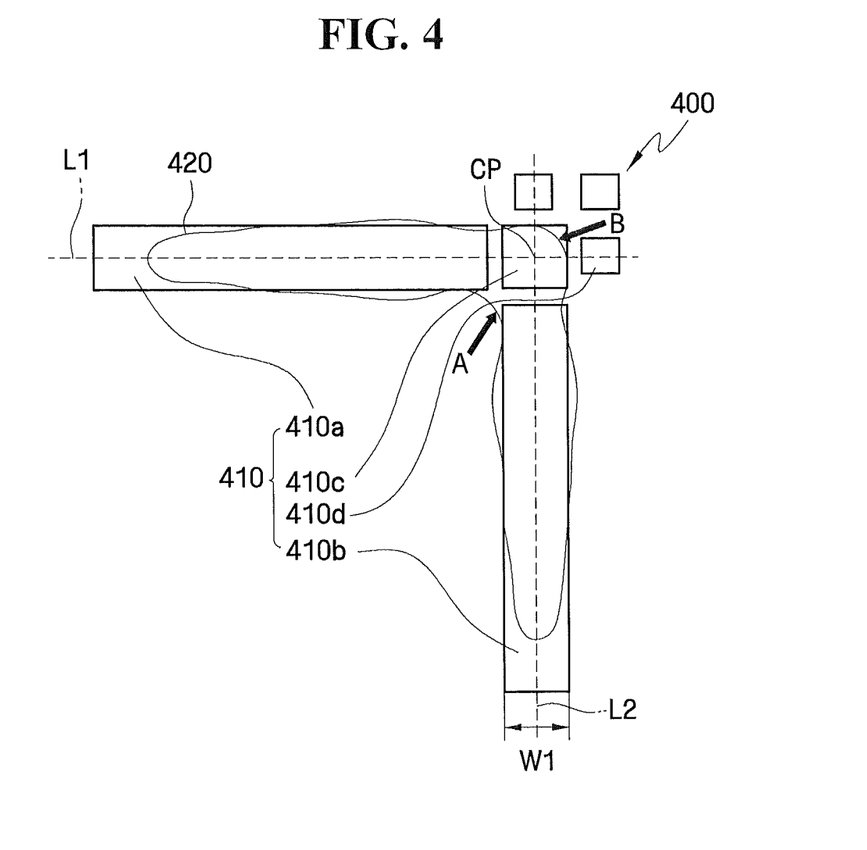
FIG. 4 illustrates a mask having a mask pattern according to Example 1 of the present invention and a simulation result in a case where the mask pattern is transferred onto a photoresist.

First, a mask having a mask pattern according to Example 1 of the present inventive subject matter will be described in comparison with conventional masks with reference to FIGS. 1 through 4. In detail, FIG. 4 illustrates a mask having a mask pattern according to Example 1 of the present inventive subject matter and a simulation result in a case where the mask pattern is transferred onto a photoresist. FIGS. 1 through 3 illustrate masks that are compared with the mask shown in FIG. 4, and have mask patterns according to Comparative Examples 1-3 and simulation results in cases where the mask patterns are transferred onto photoresists. Here, the masks shown in FIGS. 1 through 4 are used to form photoresist patterns each having a substantially inverted L shape.

First, referring to FIG. 1, to form an inverted L-shaped photoresist pattern, the mask 100 according to the Comparative Example 1 has an inverted L-shaped mask pattern 110. In detail, the inverted L-shaped mask pattern 110 includes a bar-shaped first main pattern 110a disposed in a horizontal direction and a bar-shaped second main pattern 110b disposed in a vertical direction, and respective ends of the first main pattern 110a and the second main pattern 110b overlap each other, thereby forming an inverted L-shaped pattern.

Here, the overlapping portion of the first main pattern 110a and the second main pattern 110b disposed in different directions is referred to as a crossing portion 110c. The center of the crossing portion 110c coincides with the cross point CP at which a center line L1 of the first main pattern 110a and a center line L2 of the second main pattern 110b intersect. In this comparative example, the first main pattern 110a and the second main pattern 110b may have a predetermined width W1. For example, the first main pattern 110a and the second main pattern 110b may have the width W1 of about 50 nm. However, the first main pattern 110a and the second main pattern 110b may have different widths.

In a case where the mask pattern 110 is transferred onto a photoresist, a simulation result 120 corresponds to a pattern transferred onto the photoresist from the mask pattern 110.

In the mask pattern 110 and the pattern 120 that is transferred onto a photoresist from the mask pattern 110, it is confirmed that the original shape of the mask pattern 110 around the crossing portion 110c of the mask pattern 110 is not transferred onto the photoresist as it is, which is due to an optical proximity effect. In detail, the crossing portion 110c of the mask pattern 110 is angulated while the portion of the photoresist pattern 120 corresponding to the crossing portion 110c, specifically the inward edge of the photoresist pattern 120 (see an 'A' portion of FIG. 1) is rounded.

That is to say, according to the Comparative Example 1 shown in FIG. 1, the inverted L-shaped mask pattern 110 is used in forming the inverted L-shaped photoresist pattern, which is, however, problematic in that the corner of the pattern 120 transferred onto the photoresist may be rounded.

Next, referring to FIG. 2, to form an inverted L-shaped photoresist pattern, the mask 200 according to the Comparative Example 2 includes a substantially inverted L-shaped mask pattern 210 having two patterns 210a and 210b spaced apart from each other about the cross point CP.

In detail, the mask pattern 210 has substantially the same shape as that of the mask pattern 110 according to Comparative Example 1, except that the crossing portion 110c is eliminated from the mask pattern 110 and the first main pattern 110a and the second main pattern 110b are moved away from each other by a predetermined distance W2 in horizontal and vertical directions, respectively. In this comparative example, the first main pattern 210a and the second main pattern 210b may have a predetermined width W1. For example, the first main pattern 210a and the second main pattern 210b may have the width W1 of 50 nm. Here, when the first main pattern 210a and the second main pattern 210b have a width W1 of 50 nm, the moving distance W2 may be 10 nm. However, the first main pattern 210a and the second main pattern 210b may have different widths.

Accordingly, the mask pattern 210 includes a bar-shaped first main pattern 210a disposed in a horizontal direction and a bar-shaped second main pattern 210b disposed in a vertical direction. Here, the first and second main patterns 210a and 210b may be spaced a predetermined distance apart from each other in horizontal and vertical directions about the cross point CP of a center line L1 of the first main pattern 210a and a center line L2 of the second main pattern 210b. Here, a distance between the first main pattern 210a and the cross point CP and a distance between the second main pattern 210b and the cross point CP may be substantially equal to each other.

In a case where the mask pattern 210 is transferred on to a photoresist, a simulation result 220 corresponds to a pattern transferred onto the photoresist from the mask pattern 210.

In the mask pattern 210 and the pattern 220 that is transferred onto a photoresist from the mask pattern 210, because the mask pattern 210 includes two patterns 210a and 210b spaced apart from each other, the pattern 220 transferred onto the photoresist also has disconnected parts.

That is to say, according to Comparative Example 2 shown in FIG. 2, the inverted L-shaped photoresist pattern as desired cannot be formed when the mask pattern 210 having the shape shown in FIG. 2 is used.

Next, referring to FIG. 3, to form an inverted L-shaped photoresist, the mask 300 according to Comparative Example 3 includes a roughly inverted L-shaped mask pattern 310 including first and second main patterns 310a and 310b spaced apart from each other about the cross point CP, and a third main pattern 310c spaced apart from the first and second main patterns 310a and 310b between the first and second main patterns 310a and 310b.

In detail, the first and second main patterns 310a and 310b of the mask pattern 310 are substantially the same as the first and second main patterns 210a and 210b of the mask pattern 210 according to Comparative Example 2. That is to say, the mask pattern 310 includes a bar-shaped first main pattern 310a disposed in a horizontal direction and a bar-shaped second main pattern 310b disposed in a vertical direction. Here, the first and second main patterns 310a and 310b are spaced a predetermined distance apart from each other about the cross point CP in horizontal and vertical directions. In this comparative example, widths of the first main pattern 310a and second main pattern 310b are equal to each other. However, the first main pattern 310a and the second main pattern 310b may have different widths from each other.

Further, the mask pattern 310 further includes the third main pattern 310c. The third main pattern 310c is disposed to be spaced a predetermined distance apart from each of the first and second main patterns 310a and 310b while at least overlapping the cross point CP between the first and second main patterns 310a and 310b, forming a roughly inverted L shape together with the first and second main patterns 310a and 310b.

The third main pattern 310c may be shaped as a quadrangle. Like in this embodiment, when the first main pattern 310a and second main pattern 310b have the same width, the third main pattern 310c may have a square shape. For example, the third main pattern 310c may be shaped as a square having horizontal and vertical lengths of 40 nm.

However, in an alternative embodiment, although not illustrated, where the first main pattern 310a and the second main pattern 310b have different widths, the third main pattern 310c may have a rectangular shape. In this case, one side of the third main pattern 310c adjacent to the first main pattern 310a and its opposite side are smaller than a width of the first main pattern 310a, In addition, one side of the third main pattern 310c adjacent to the second main pattern 310b and its opposite side are smaller than a width of the second main pattern 310b.

As the third main pattern 310c is arranged in the above-described manner, it can be divided into a portion opposed to and adjacent with the first and second main patterns 310a and 310b, that is, a part surrounded by the first and second main patterns 310a and 310b, and the other part. For example, when the third main pattern 310c is shaped as a quadrangle, the third main pattern 310c has two sides adjacent with the first main pattern 310a and the second main pattern 310b, and the other two sides.

When the mask pattern 310 is transferred to a photoresist, the simulation result is identified by reference numeral 320. That is to say, reference numeral 320 denotes a pattern of the mask pattern 310 transferred onto a photoresist.

In the mask pattern 310, and the pattern 320 of the mask pattern 310 transferred onto the photoresist, it is confirmed that the pattern 320 of the mask pattern 310 transferred onto the photoresist is closer to an inverted L-shape, as desired, than in Comparative Examples 1 and 2. That is to say, there is little rounded shape at the inward corner A of the pattern 320 transferred to the photoresist. However, creation of a dent shape is still problematic, that is, the outer corner B of the pattern 320 transferred to the photoresist is recessed compared to the surrounding area.

That is to say, even with the mask according to Comparative Example 3 shown in FIG. 3, it is difficult to form a desired inverted L-shaped photoresist pattern.

Therefore, an improved mask pattern having a new shape over the masks according to Comparative Examples 1-3 is proposed in this embodiment, as illustrated in FIG. 4.

Referring to FIG. 4, in form an inverted L-shaped photoresist, the mask 400 according to Example 1 of the present inventive subject matter includes a roughly inverted L-shaped mask pattern 410 including first and second main patterns 410a and 410b spaced apart from each other about the cross point CP, a third main pattern 410c spaced apart from the first and second main patterns 410a and 410b between the first and second main patterns 410a and 410b, and an auxiliary pattern 410d disposed around the third main pattern 410c.

In detail, the first through third main patterns 410a, 410b, and 410c of the mask pattern 410 are substantially the same as the first through third main patterns 310a, 310b, and 310c of the mask pattern 310 according to Comparative Example 3. That is to say, the mask pattern 410 includes a bar-shaped first main pattern 410a disposed in a horizontal direction and a bar-shaped second main pattern 410b disposed in a vertical direction. Here, the first and second main patterns 410a and 410b may be spaced a predetermined distance apart from each other about the cross point CP in horizontal and vertical directions, respectively. In this example of the present inventive subject matter, the first main pattern 410a and the second main pattern 410b may have the same widths, but aspects of the present inventive subject matter are not limited thereto. Alternatively, the first main pattern 410a and the second main pattern 410b may have different widths.

In addition, the third main pattern 410e of the mask pattern 410 is disposed to be spaced a predetermined distance apart from each of the first and second main patterns 410a and 410b while overlapping at least the cross point CP between the first and second main patterns 410a and 410b, forming a roughly inverted L shape together with the first and second main patterns 410a and 410b.

As the third main pattern 410e is arranged in the above-described manner, it can be divided into a portion opposed to and adjacent with the first and second main patterns 410a and 410b, that is, a portion surrounded by the first and second main patterns 410a and 410b, and the other portion. For example, in a case where the third main pattern 410c is shaped as a quadrangle, the third main pattern 410c has two sides adjacent with the first main pattern 410a and the second main pattern 410b, and the other two sides.

The mask pattern 410 further includes the auxiliary pattern 410d. At least one portion of the auxiliary pattern 410d is disposed around the third main pattern 410e so as to surround the other portion except for the portion of the third main pattern 410c adjacent with the first and second main patterns 410a and 410b, while being spaced a predetermined distance apart from the third main pattern 410c. Here, the size of the auxiliary pattern 410d is smaller than that of the third main pattern 410c, which is for the purpose of preventing the auxiliary pattern 410d from being transferred to the photoresist after exposure.

In this example of the present inventive subject matter, the third main pattern 410c may be shaped of a quadrangle. The third main pattern includes two sides adjacent to the first and second main patterns 410a and 410b, and the other two sides. In this case, the auxiliary pattern 410d may have three patterns arranged so as to correspond to the other two sides among four sides of the third main pattern 410c and the corner between the other two sides.

In addition, according to this embodiment, the auxiliary pattern 410d may be shaped as a quadrangle. For example, when the third main pattern 410c may be shaped as a square having horizontal and vertical lengths of 40 nm, the respective auxiliary patterns 410d may have be shaped of a square having horizontal and vertical lengths of 20 nm, but aspects of the present inventive subject matter are not limited thereto. Alternatively, the auxiliary pattern 410d may have various shapes including square, rectangular, rhombus, and the like.

When the mask pattern 410 is transferred to a photoresist, the simulation result is identified by reference numeral 420. That is to say, reference numeral 420 denotes a pattern of the mask pattern 410 transferred onto a photoresist.

In the mask pattern 410, and the pattern 420 of the mask pattern 410 transferred onto the photoresist, it is confirmed that the pattern 420 of the mask pattern 410 transferred onto the photoresist is closer to an inverted L-shape, as desired, than in Comparative Examples 1-3. That is to say, there is little rounded shape at the inward corner A of the pattern 420 transferred to the photoresist. Also, creation of a dent shape is suppressed, that is, the outer corner B of the pattern 420 transferred to the photoresist is not recessed compared to the surrounding area.

Consequently, referring to FIGS. 1 through 4, like in Example 1 of the present inventive subject matter, when the mask pattern 410 including the auxiliary pattern 410*d* is transferred to the photoresist, a desired inverted L-shaped photoresist pattern may be formed.

Figure 5:
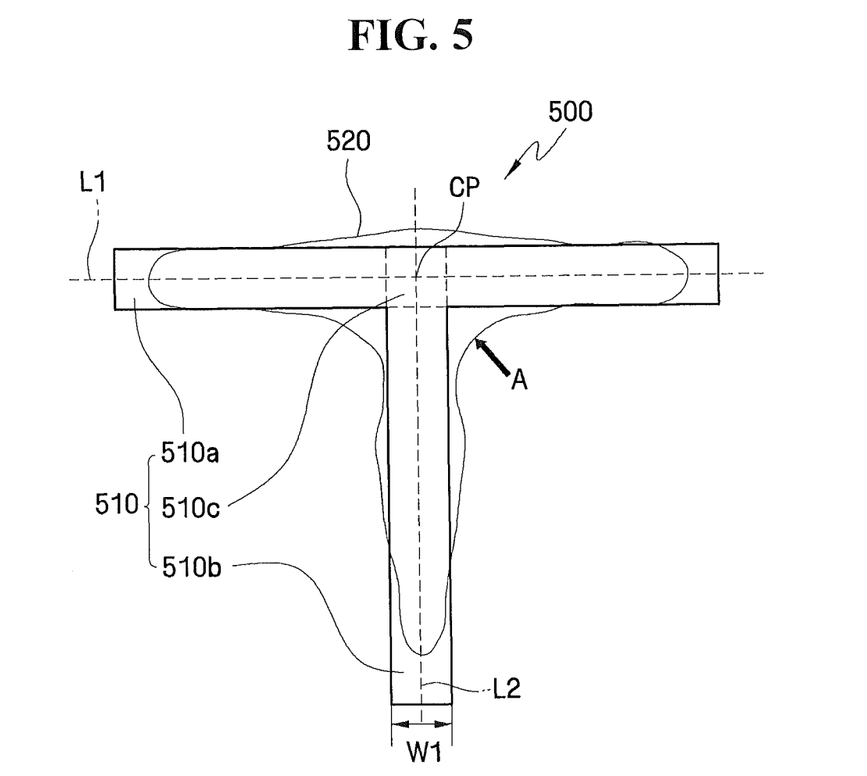
FIGS. 5 through 7 illustrate masks to be compared with a mask shown in FIG. 8.
Figure 6:
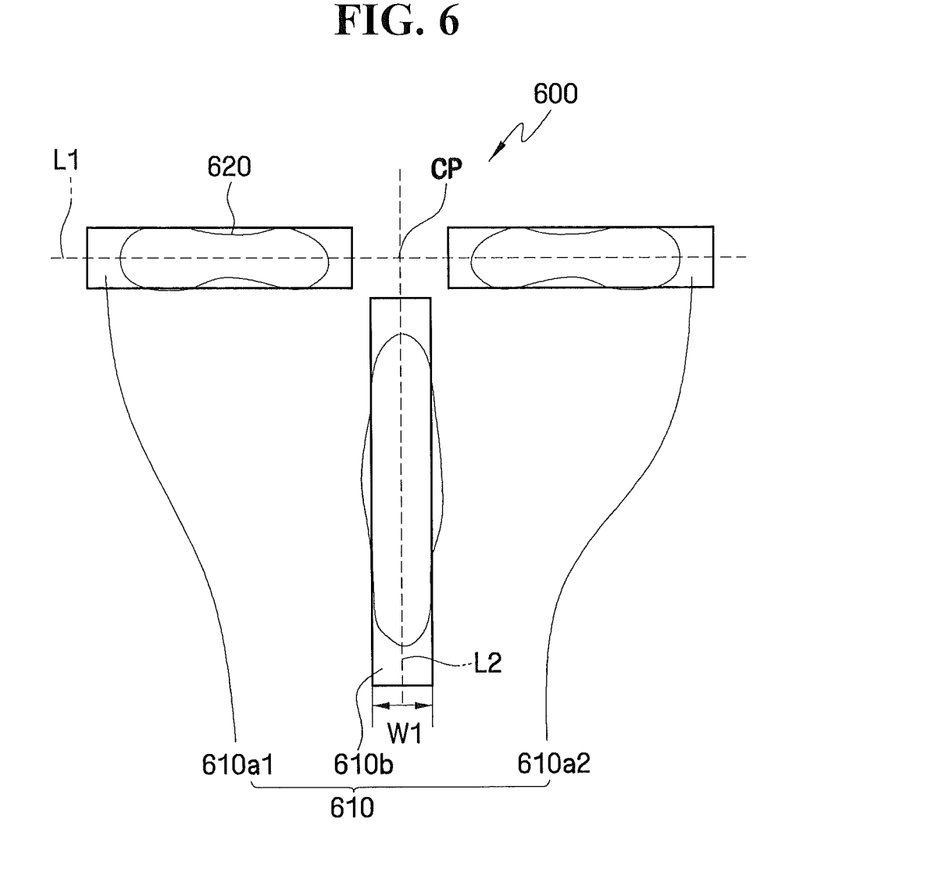
Figure 7:
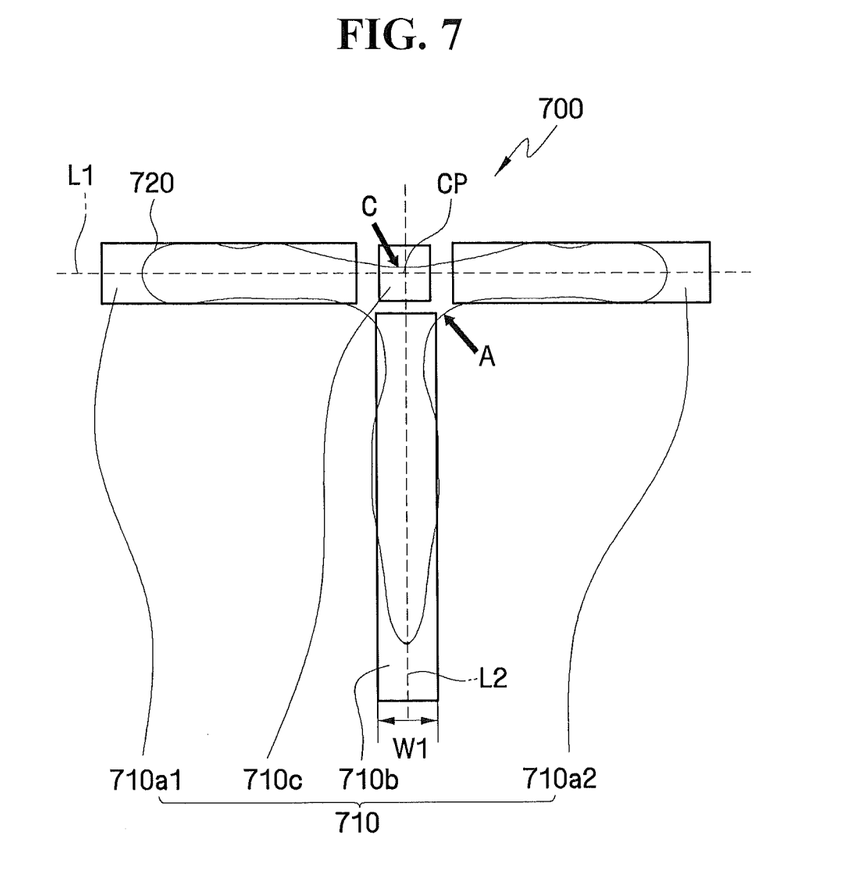
Figure 8:
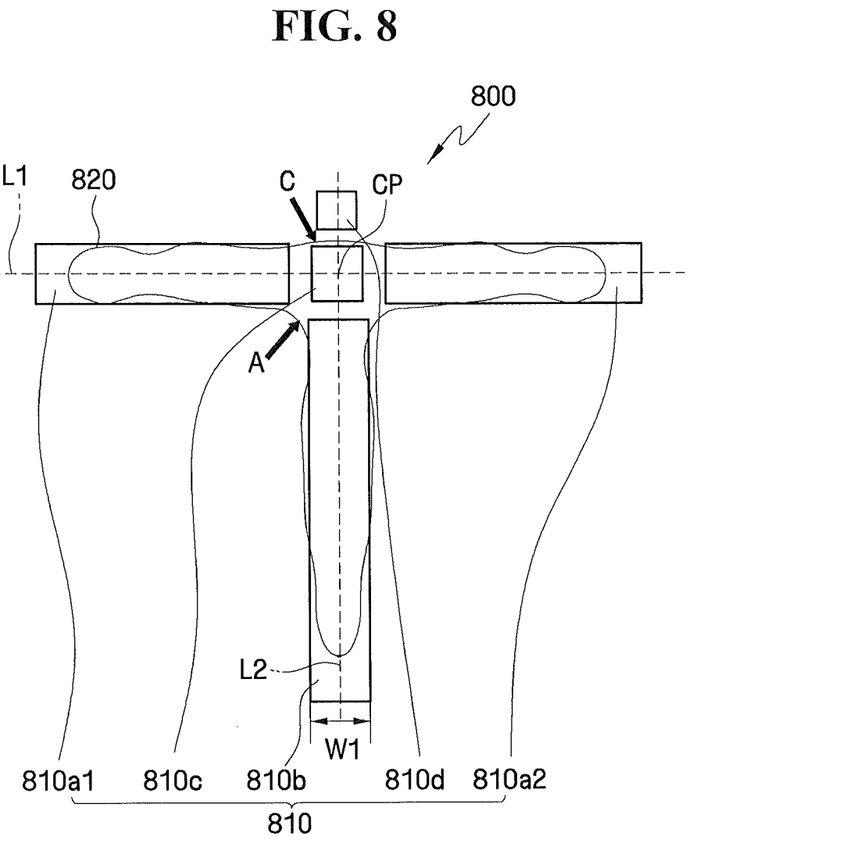
FIG. 8 illustrates a mask having a mask pattern according to Example 2 of the present invention and a simulation result in a case where the mask pattern is transferred onto a photoresist.

Next, a mask for forming a pattern of a semiconductor device according to Example 2 of the present inventive subject matter will be described in comparison with conventional masks with reference to FIGS. 5 through 8. In detail, FIG. 8 illustrates a mask having a mask pattern according to Example 2 of the present inventive subject matter and a simulation result in a case where the mask pattern is transferred onto a photoresist, and FIGS. 5 through 7 illustrate masks to be compared with a mask shown in FIG. 8, Specifically, FIGS. 5 through 8 illustrate masks having mask patterns according to Comparative Examples 4-6 and simulation results in cases where the mask patterns are transferred onto photoresists. Here, the masks shown in FIGS. 5 through 8 are used to form photoresist patterns each having a substantially T shape.

First, referring to FIG. 5, to form a T-shaped photoresist pattern, the mask 500 according to Comparative Example 4 has a T-shaped mask pattern 510. In detail, the T-shaped mask pattern 510 includes a bar-shaped first main pattern 510*a* disposed in a horizontal direction and a bar-shaped second main pattern 510*b* disposed in a vertical direction. Here, the center of the first main pattern 510*a* and one end of the second main pattern 510*b* overlap each other, thereby achieving a T-shaped pattern.

Here, the overlapping portion of the first main pattern 510*a* and the second main pattern 510*b* disposed in different directions is referred to as a crossing portion 510*c*. The center of the crossing portion 510*c* coincides with the cross point CP at which a center line L1 of the first main pattern 510*a* and a center line L2 of the second main pattern 510*b* intersect. In addition, the first main pattern 510*a* and the second main pattern 510*b* may have a predetermined width W1. For example, the first main pattern 510*a* and the second main pattern 510*b* may have a width W1 of 50 nm. However, the first main pattern 510*a* and the second main pattern 510*b* may have different widths, as already described above.

In a case where the mask pattern 510 is transferred onto a photoresist, a simulation result 520 corresponds to a pattern transferred onto the photoresist from the mask pattern 510.

In the mask pattern 510 and the pattern 520 that is transferred onto a photoresist from the mask pattern 510, it is confirmed that the original shape of the mask pattern 510 around the crossing portion 510*c* of the mask pattern 510 is not transferred onto the photoresist as it is, which is due to an optical proximity effect. In detail, the crossing portion 510*c* of the mask pattern 510 is angulated below the crossing portion 510*c* while the crossing portion 510*c* of the photoresist pattern 520, specifically the inward edge of the photoresist pattern 520 (see an 'A' portion of FIG. 5) is rounded.

That is to say, according to Comparative Example 4 shown in FIG. 5, the T-shaped mask pattern 510 is used in forming the T-shaped photoresist pattern, which is, however, problematic in that the inward corner A of the pattern 520 transferred onto the photoresist may be rounded.

Next, referring to FIG. 6, to form a T-shaped photoresist pattern, a mask 600 according to Comparative Example 5 includes a substantially T-shaped mask pattern 610 having three patterns 610*a*1, 610*a*2 and 610*b* spaced apart from each other about the cross point CP.

In detail, the mask pattern 610 has substantially the same shape as that of the mask pattern 510 according to Comparative Example 5, except that the crossing portion 510*c* is eliminated from the mask pattern 510 and the first main pattern 510*a* with two distinct parts in a horizontal direction and second main pattern 510*b* are moved with respect to each other by a predetermined distance W2 in horizontal and vertical directions, respectively. Here, each of the first main pattern 510*a* and the second main pattern 510*b* may have a predetermined width, for example, 50 nm. In this case, the distance in which they are moved away from each other may be, for example, 10 nm. However, each of the first main pattern 510*a* and the second main pattern 510*b* may have different widths.

Accordingly, the mask pattern 610 includes bar-shaped first main patterns 610*a*1 and 610*a*2 disposed in a horizontal direction and a bar-shaped second main pattern 610*b* disposed in a vertical direction. Here, the first main patterns 610*a*1 and 610*a*2 include two patterns spaced a predetermined distance apart from each other to be disposed equally in a horizontal direction about the cross point CP, while the second main pattern 610*b* is spaced a predetermined distance apart from the cross point CP in a vertical direction to be disposed apart from the first main patterns 610*a*1 and 610*a*2.

When the mask pattern 610 is transferred to a photoresist, the simulation result is identified by reference numeral 620. That is to say, reference numeral 620 denotes a pattern of the mask pattern 610 transferred onto a photoresist.

In the mask pattern 610, and the pattern 620 of the mask pattern 610 transferred onto the photoresist, since the mask pattern 610 includes three patterns 610*a*1, 610*a*2, and 610*b* spaced apart from each other, the pattern 620 transferred onto the photoresist also has three spaced-apart pattern parts.

That is to say, according to Comparative Example 5 shown in FIG. 6, a desired T-shaped pattern cannot be obtained by using the mask pattern 610 shown in FIG. 6.

Next, referring to FIG. 7, to form a T-shaped photoresist pattern, a mask 700 according to Comparative Example 6 includes a substantially T-shaped mask pattern 710 having first and second main patterns 710*a*1, 710*a*2, and 710*b* spaced apart from each other about the cross point CP and a third main pattern 710*c* spaced apart therebetween.

In detail, the first main patterns 710*a*1 and 710*a*2 and the second main pattern 710*b* of the mask pattern 710 are substantially the same as the first main patterns 610*a*1 and 610*a*2 and the second main pattern 610*b* of the mask pattern 610 according to Comparative Example 5. In detail, the mask pattern 710 includes bar-shaped first main patterns 710*a*1 and 710*a*2 disposed in a horizontal direction and a bar-shaped second main pattern 710*b* disposed in a vertical direction. Here, the first main patterns 710*a*1 and 710*a*2 include two patterns spaced a predetermined distance apart from each other to be disposed equally in a horizontal direction about the cross point CP, while the second main pattern 710*b* is spaced a predetermined distance apart from the cross point CP in a vertical direction to be disposed apart from the first main patterns 710*a*1 and 710*a*2.

In this comparative example, the first main patterns 710*a*1 and 710*a*2 and the second main pattern 710*b* may have the same widths, but aspects of the present inventive subject matter are not limited thereto. Alternatively, the first main patterns 710a1 and 710a2 and the second main pattern 710b may have different widths.

The mask pattern 710 further includes the third main pattern 710c. The third main pattern 710c is disposed to be spaced a predetermined distance apart from each of the first main patterns 710a1 and 710a2 and the second main pattern 710b while overlapping at least the cross point CP between each of the first main patterns 710a1 and 710a2 and the second main pattern 710b, forming a roughly T shape together with the first main patterns 710a1 and 710a2 and the second main pattern 710b.

The third main pattern 710e may be shaped as a quadrangle. In this embodiment, when the first main patterns 710a1 and 710a2 and the second main pattern 710b have the same width, the third main pattern 710c may have a square shape. For example, the third main pattern 710c may be shaped as a square having horizontal and vertical lengths of 40 nm.

However, in an alternative embodiment, although not illustrated, where the first main patterns 710a1 and 710a2 and the second main pattern 710b have different widths, the third main pattern 710c may have a rectangular shape. In this case, widths of two sides of the third main pattern 710c adjacent to the first main patterns 710a1 and 710a2 are smaller than those of the first main patterns 710a1 and 710a2. In addition, widths of one side of the third main pattern 710c adjacent to the second main pattern 710b and its opposite side are smaller than a width of the second main pattern 710b.

As the third main pattern 710c is arranged in the above-described manner, it can be divided into parts adjacent to the first main patterns 710a1 and 710a2 and the second main pattern 710b, that is, parts surrounded by the first main patterns 710a1 and 710a2 and the second main pattern 710b and the other part. For example, when the third main pattern 710c is shaped as a quadrangle, the third main pattern 710c has two sides opposed to the first main patterns 710a1 and 710a2, respectively, one side opposed to the second main pattern 710b, and the other side.

When the mask pattern 710 is transferred to a photoresist, the simulation result is identified by reference numeral 720. That is to say, reference numeral 720 denotes a pattern of the mask pattern 710 transferred onto a photoresist.

In the mask pattern 710, and the pattern 720 of the mask pattern 710 transferred onto the photoresist, it is confirmed that there is little rounded shape at the inward corner A of the pattern 720 transferred to the photoresist. However, a dent shape (see a portion 'C' of FIG. 7) is observed from the pattern 720 transferred to the photoresist corresponding to the parts of the third main pattern 710c, which are not surrounded by first main patterns 710a1 and 710a2 and the second main pattern 720b, and is recessed compared to the surrounding area.

That is to say, even with the mask according to Comparative Example 6 shown in FIG. 7, it is difficult to form a desired T-shaped photoresist pattern.

Therefore, an improved mask pattern having a new shape over the masks according to Comparative Examples 4-6 is proposed in this embodiment, as illustrated in FIG. 8.

Referring to FIG. 8, to form a T-shaped photoresist, a mask 800 according to Example 2 of the present inventive subject matter is roughly T-shaped and has a mask pattern 810 including first and second main patterns 810a1, 810a2, and 810b spaced apart from each other about the cross point CP, a third main pattern 810c spaced apart from the first and second main patterns 810a1, 810a2, and 810b between each of the first and second main patterns 810a1 and 810a2 and 810b, and an auxiliary pattern 810d disposed around the third main pattern 810c.

In detail, the first main patterns 810a1 and 810a2, the second main pattern 810b, and the third main pattern 810c of the mask pattern 810 are substantially the same as the first main patterns 710a1 and 710a2, the second main pattern 710b, and the third main pattern 710c of the mask pattern 710 according to Comparative Example 6. That is to say, the mask pattern 810 includes bar-shaped first main patterns 810a1 and 810a2 disposed in a horizontal direction and a bar-shaped second main pattern 810b disposed in a vertical direction. Here, the first main patterns 810a1 and 810a2 may include two patterns spaced a predetermined distance apart from each other about the cross point CP equally in a horizontal direction, and the second main pattern 810b is spaced a predetermined distance apart from the cross point CP in the vertical direction to be spaced apart from the first main patterns 810a1 and 810a2. The mask pattern 810 further includes the third main pattern 810c.

The third main pattern 810c is disposed to be spaced a predetermined distance apart from each of the first main patterns 810a1 and 810a2 and the second main pattern 810b while overlapping at least the cross point CP between each of the first main patterns 810a1 and 810a2 and the second main pattern 810b, forming a roughly T shape together with the first main patterns 810a1 and 810a2 and the second main pattern 810b.

As the third main pattern 810c is arranged in the above-described manner, it can be divided into parts adjacent to the first main patterns 810a1 and 810a2 and the second main pattern 810b, that is, parts surrounded by the first main patterns 810a1 and 810a2 and the second main pattern 810b and the other part. For example, when the third main pattern 810 is shaped as a quadrangle, the third main pattern 810c has two sides opposed to the first main patterns 810a1 and 810a2, respectively, one side opposed to the second main pattern 810b, and the other side.

The mask pattern 810 further includes an auxiliary pattern 810d. At least one portion of the auxiliary pattern 810d is disposed around the third main pattern 810c to be spaced a predetermined distance apart from the third main pattern 810c so as to surround a portion other than the portions of the third main pattern 810c adjacent to the first main patterns 810a1 and 810a2 and the second main pattern 810b. Here, the size of the auxiliary pattern 810d is smaller than that of the third main pattern 810c.

In this embodiment, the third main pattern 810c may be shaped as a quadrangle. In this case, the auxiliary pattern 810d may have one pattern arranged so as to correspond to one side among four sides of the third main pattern 810c, the one side not facing the first main patterns 810a1 and 810a2 and the second main pattern 810b. In addition, in this embodiment, the auxiliary pattern 810d may be shaped as a quadrangle. For example, when the third main pattern 810c may be shaped as a square having horizontal and vertical lengths of 40 nm, the auxiliary pattern 810d may be shaped as a square having horizontal and vertical lengths of 30 nm, but aspects of the present inventive subject matter are not limited thereto. Alternatively, the auxiliary pattern 810d may have various shapes including square, rectangular, rhombus, and the like.

When the mask pattern 810 is transferred to a photoresist, the simulation result is identified by reference numeral 820. That is to say, reference numeral 820 denotes a pattern of the mask pattern 810 transferred onto a photoresist.

In the mask pattern 810, and the pattern 820 of the mask pattern 810 transferred onto the photoresist, it is confirmed that the pattern 820 of the mask pattern 810 transferred onto the photoresist is much closer to a T-shape, as desired, than in Comparative Examples 4-6. That is to say, there is little rounded shape at the inward corner A of the pattern 820 transferred to the photoresist. Additionally, a dent shape is barely created, that is, the upper line C around the cross point CP of the pattern 820 transferred to the photoresist is recessed compared to the surrounding area.

Consequently, referring to FIGS. 5 through 8, like in Example 2 of the present inventive subject matter, when the mask pattern 810 including the auxiliary pattern 810d is transferred to the photoresist, a desired T-shaped photoresist pattern may be obtained.

While the above-described embodiments have been described and shown with respect to mask patterns for forming inverted L-shaped or T-shaped photoresist patterns, aspects of the present inventive subject matter are not limited thereto.

The present inventive subject matter can also be applied to all cases of forming a photoresist pattern having a plurality of patterns arranged about one cross point. In such a case, the mask pattern has substantially the same shape as the photoresist pattern to be formed and includes a plurality of main patterns spaced apart from each other about the cross point, other main patterns disposed to overlap the cross point between each of the plurality of main patterns, and auxiliary patterns disposed around other main patterns, specifically around non-adjacent patterns of the main patterns.

For example, the present inventive subject matter can be applied to cases in which photoresist patterns of all shapes are to be formed by rotating the inverted L- and T shapes at a right angle (for example, a "⊦" shape, a "⌐" shape, and the like).

Figure 9:
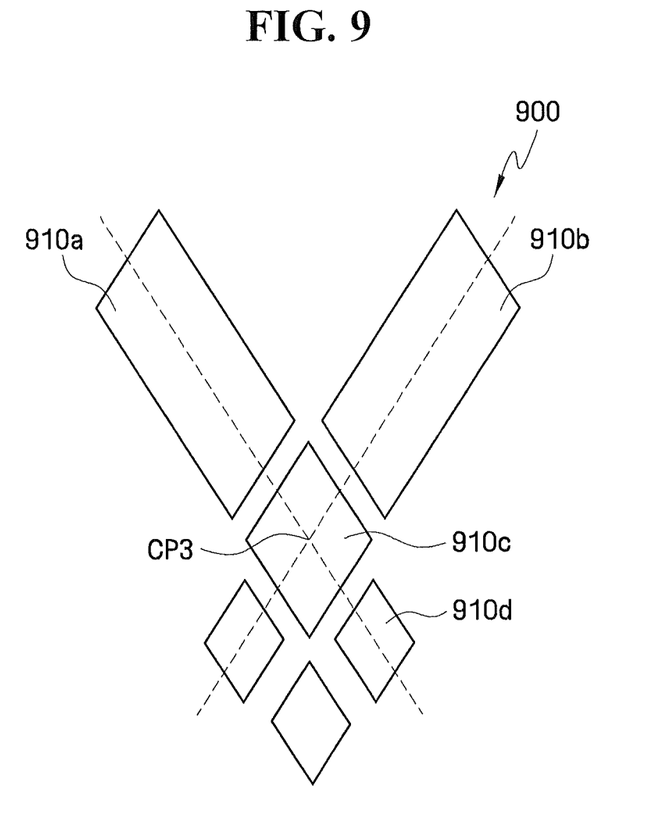
FIG. 9 illustrates a mask having a mask pattern according to Example 3 of the present invention.
Figure 10:
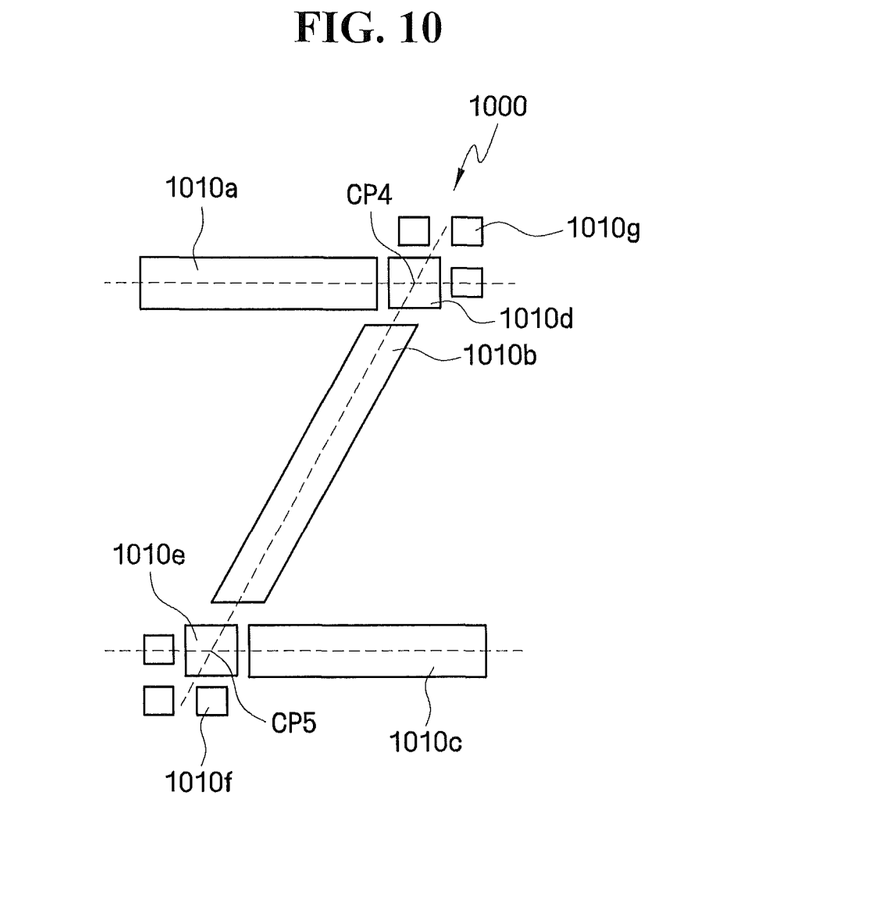
FIG. 10 illustrates a mask having a mask pattern according to Example 4 of the present invention.

Additionally, the present inventive subject matter may also be applied to cases in which a variety of photoresist patters having a plurality of patterns crossing each other in different directions while not being perpendicular to each other, are to be formed, such as V-shaped photoresist pattern, Z-shaped photoresist patterns, or the like, examples of which are illustrated in FIGS. 9 and 10.

FIG. 9 illustrates a mask having a mask pattern according to Example 3 of the present inventive subject matter. Here, the mask shown in FIG. 9 is practically used to form a V-shaped photoresist pattern.

Referring to FIG. 9, the mask pattern formed in the mask 900 according to Example 3 of the present inventive subject matter is roughly V-shaped and includes two main patterns 910a and 910b spaced apart from each other about the cross point CP3, other main pattern 910c disposed to be spaced a predetermined distance apart from each of the main patterns 910a and 910b while overlapping the cross point CP3, and an auxiliary pattern 910d disposed around the other main pattern 910c, specifically around non-adjacent patterns of the main patterns 910a and 910b. The auxiliary pattern 910d is smaller than other main pattern 910c and may have various sizes, shapes and numbers. In the illustrated embodiment, the auxiliary pattern 910d is shaped as a quadrangle and has three patterns arranged.

FIG. 10 illustrates a mask having a mask pattern according to Example 4 of the present inventive subject matter. Here, the mask shown in FIG. 10 is practically used to form a Z-shaped photoresist pattern.

Referring to FIG. 10, the mask pattern formed in the mask 1000 according to Example 4 of the present inventive subject matter is roughly Z-shaped and includes three main patterns 1010a, 1010b, and 1010c spaced apart from each other about cross points CP4 and CP5, other main patterns 1010d and 1010e disposed to be spaced a predetermined distance apart from each other between each of the main patterns 1010a, 1010b, and 1010c while overlapping the cross points CP4 and CP5, and auxiliary patterns 1010f and 1010g disposed around the other main patterns 1010d and 1010e, specifically around non-adjacent patterns of the main patterns 1010a, 1010b, and 1010c. The auxiliary patterns 1010f and 1010g are smaller than other main patterns 1010d and 1010e and may have various sizes, shapes and numbers. In the illustrated embodiment, the auxiliary patterns 1010f and 1010g are shaped as a quadrangle and have each three patterns arranged around the other main patterns 1010d and 1010e.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

That which is claimed:

1. A mask comprising:
   first and second main patterns disposed to be spaced apart from each other about a cross point and extending in first and second directions different from each other;
   a third main pattern disposed spaced apart from the first and second main patterns while being disposed between the first and second main patterns so as to overlap the cross point; and
   at least one auxiliary pattern spaced apart from the third main pattern in the periphery of a portion of the third main pattern, which is not adjacent with the first and second main patterns.

2. The mask of claim 1, wherein a width of the auxiliary pattern is smaller than that of the third main pattern.

3. The mask of claim 2, wherein a width of the third main pattern is smaller than widths of the first and second main patterns.

4. The mask of claim 1, wherein the auxiliary pattern is shaped as a quadrangle.

5. The mask of claim 4, wherein the third main pattern is shaped as a quadrangle.

6. The mask of claim 5, wherein the first main pattern is shaped as a bar extending in the first direction, and the second main pattern is shaped as a bar extending in the second direction.

7. The mask of claim 1, wherein the third main pattern is shaped as a quadrangle and includes two sides adjacent to the first and second main patterns, and two other sides, and the auxiliary pattern includes first and second auxiliary patterns respectively adjacent to the two other sides, and a third auxiliary pattern adjacent to a corner between the other two sides.

8. The mask of claim 7, wherein each of the first through third auxiliary patterns is shaped as a quadrangle.

9. The mask of claim 8, wherein a width of each of the first through third auxiliary patterns is smaller than that of the third main pattern, and a width of the third main pattern is smaller than widths of the first and second main patterns.

10. The mask of claim 9, wherein the width of each of the first and second main patterns is about 50 nm, the width of the third main pattern is about 40 nm, and the width of each of the first through third auxiliary patterns is about 20 nm.

11. The mask of claim 1, wherein the first main pattern includes two patterns spaced apart from each other about the cross point while being disposed in the first direction.

12. The mask of claim 11, wherein the third main pattern is shaped of a quadrangle and includes two sides adjacent to the two patterns included in the first main pattern, a side adjacent to the second main pattern, and an other side, and the auxiliary pattern is disposed adjacent to the other side of the third main pattern.

13. The mask of claim 12, wherein the auxiliary pattern is shaped as a quadrangle.

14. The mask of claim 13, wherein a width of the auxiliary pattern is smaller than that of the third main pattern and a width of the third main pattern is smaller than widths of the first and second main patterns.

15. The mask of claim 14, wherein the width of each of the first and second main patterns is about 50 nm, the width of third main pattern is about 40 nm, and the width of the auxiliary pattern is about 30 nm.

16. The mask of claim 1, wherein the first direction and the second direction are perpendicular to each other.

17. A mask for forming a semiconductor pattern, comprising:
   a first main pattern that defines a first center line;
   a second main pattern that defines a second center line, the first and second center lines intersecting at a cross point;
   a third main pattern disposed on the cross point; and
   an auxiliary pattern;
   wherein the third main pattern is disposed between the auxiliary pattern and at least one of the first and second main patterns.

18. The mask of claim 17, wherein the first center line and the second center line are substantially perpendicular with each other.

19. The mask of claim 17, wherein the first center line and the second center line form an oblique angle with respect to each other.

20. The mask of claim 17, wherein the first main pattern comprises a first main subpattern and a second main subpattern, and wherein the third main pattern is disposed between the first and second main subpatterns.

* * * * *